(12) United States Patent
Chang et al.

(10) Patent No.: US 6,800,558 B1
(45) Date of Patent: Oct. 5, 2004

(54) PHOTORESIST SCUM FOR COPPER DUAL DAMASCENE PROCESS

(75) Inventors: Chung-Liang Chang, Hsin-chu (TW); Ching Hua Hsieh, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/043,863

(22) Filed: Jan. 10, 2002

(51) Int. Cl.$^7$ .............................................. H01L 21/302
(52) U.S. Cl. .................. 438/700; 438/723; 438/725
(58) Field of Search ............................... 438/700, 702, 438/692, 720, 723, 724, 725

(56) References Cited

U.S. PATENT DOCUMENTS

| | | | |
|---|---|---|---|
| 5,547,642 A | | 8/1996 | Seiwa et al. .............. 422/186.3 |
| 5,643,407 A | * | 7/1997 | Chang ......................... 438/623 |
| 6,017,817 A | * | 1/2000 | Chung et al. ............... 438/637 |
| 6,025,259 A | | 2/2000 | Yu et al. ...................... 438/618 |
| 6,042,999 A | * | 3/2000 | Lin et al. ..................... 430/316 |
| 6,074,941 A | | 6/2000 | Hsieh et al. ................. 438/624 |
| 6,228,755 B1 | | 5/2001 | Kusumi et al. ............. 438/618 |
| 6,251,774 B1 | * | 6/2001 | Harada et al. .............. 438/637 |
| 6,284,657 B1 | * | 9/2001 | Chooi et al. ................ 438/687 |
| 6,319,809 B1 | * | 11/2001 | Chang et al. ............... 438/597 |

* cited by examiner

*Primary Examiner*—Kin-Chan Chen
(74) *Attorney, Agent, or Firm*—Haynes and Boone, LLP

(57) ABSTRACT

A new method is provided of treating the wafer in or on the surface of which a patterned and developed layer of photoresist has been created for the purpose of creating openings in underlying layers of semiconductor material. The wafer is exposed, after the via or plug etch has been completed, to high temperature of between about 250 and 400 degrees C., using a hot plate or a furnace, in an environment of low or atmospheric pressure. The exposure of the wafer to elevated temperatures can be in an environment with or without inert gasses or with or without the presence of a base or forming gas. The dual damascene structure is then completed using a layer of DUV photo, an trench opening is created in the layer of DUV photoresist that aligns with the via opening.

44 Claims, 4 Drawing Sheets

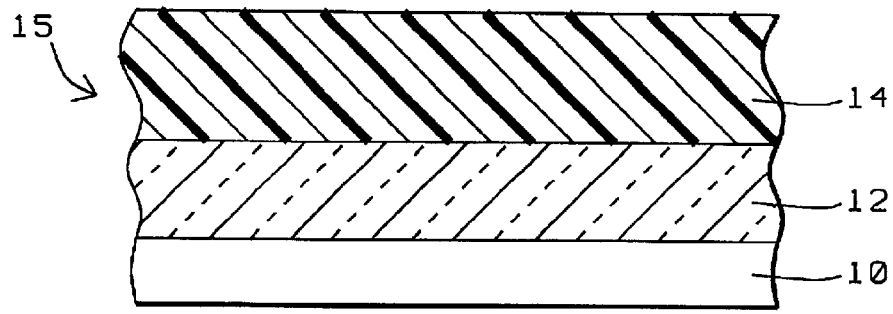
FIG. 1A - Prior Art
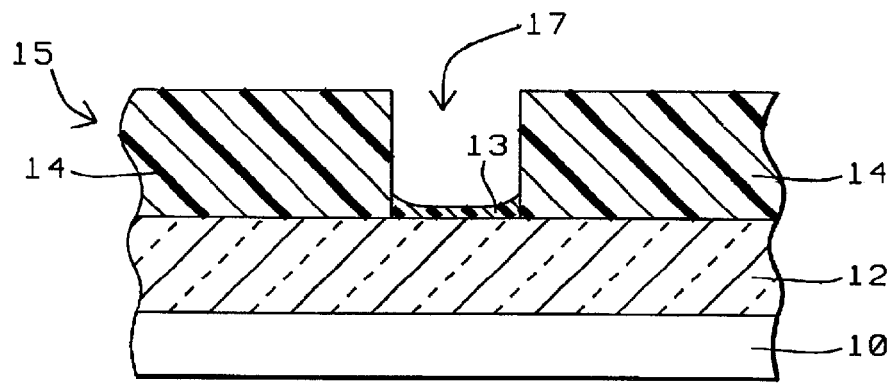
FIG. 1B - Prior Art
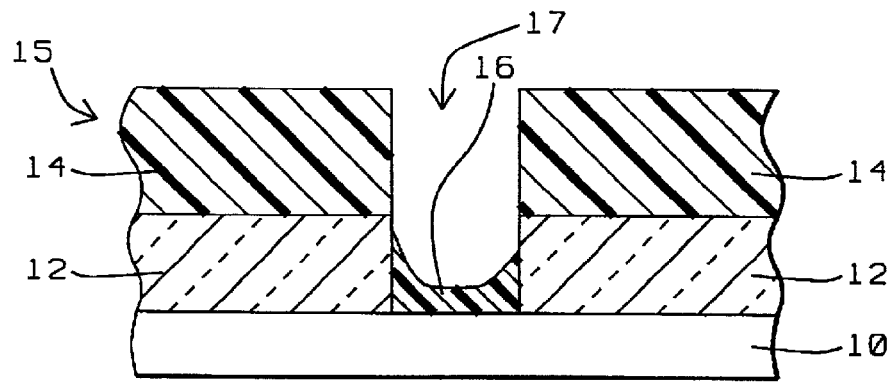
FIG. 1C - Prior Art

PHOTORESIST SCUM FOR COPPER DUAL DAMASCENE PROCESS

BACKGROUND OF THE INVENTION (1) Field of the Invention

The invention relates to the fabrication of integrated circuit devices, and more particularly, to a method for improved removal of photoresist remnants or scum as this scum occurs as part of trench lithography applied for dual damascene processes.

(2) Description of the Prior Art

The creation of semiconductor devices comprises the creation of multiple conductive regions, isolated from each other by dielectric layers, on the surface of a semiconductor substrate. Some of the dielectrics, such as silicon dioxide, can be grown on the surface of the substrate or can be physically deposited by for instance a sputtering process or by other chemical methods of dielectric deposition. The native properties of a dielectric can further be altered by doping the dielectric layer by either n-type dopants such as arsenic and phosphorous or p-type dopants such as indium or boron.

To interconnect the various layers of conductive lines that are created within the structure of a semiconductor device, contact and via openings are created in the dielectric. These openings are filled with a conductive material that can contain tungsten, titanium nitride, molybdenum, silicide and polysilicon but typically contains tungsten, wolfram or copper.

The process of creating one or more openings starts with the deposition of a layer of dielectric (the dielectric into which the openings are to be made) over which a layer of photoresist is deposited. The layer of photoresist is patterned in accordance with the desired pattern of the openings, the photoresist is removed above the layer of dielectric in accordance with the pattern for the to be created openings. The dielectric layer is then etched, that is the dielectric is removed in accordance with the pattern of the openings. A dry etch is typically performed, exposing the dielectric layer to a plasma that is created by using one or more gasses that expose the surface of the dielectric where the photoresist has been removed. The type of etchant that is applied for a particular step of etching the openings will be determined by the processing and functional application of the openings within the overall device structure.

Increased circuit density brings with it the need to create openings that have a high aspect ratio. For high aspect ratio openings, it is critical that openings are created that have a profile that allows for complete penetration of the conductive material such as metal that fills the opening while the profile of the opening must be such that good adhesion is established between the deposited metal and the sidewalls of the openings. To avoid distortion of the photoresist patterns that are used to create the openings on the dielectric layer, Anti Reflective Coating (ARC) is frequently applied over the surface of the opening. Photolithographic patterning problems can be caused by the increase in use of highly reflective materials such as polysilicon, aluminum, and metal silicides in the creation of the semiconductor device. These materials can cause unwanted reflections from the underlying layers, resulting in distortion of the creation of the openings. Anti Reflective Coatings (ARC) are used to minimize the adverse impact due to reflectance from these reflective materials.

The invention addresses the concern that for trench photolithography, as this technology is currently applied for the creation of dual damascene structures, no pre-treatment method of the applied layer of photoresist is available for the complete removal of photoresist scum after the layer of photoresist has been developed. The remaining photoresist scum distorts the etch profile, causing poor etch results and the formation of poorly defined interconnect structures such as dual damascene structures. The invention provides such a method that removes photoresist scum and that therefore can be applied for the creation of well defined conductive interconnects.

U.S. Pat. No. 6,025,259 (Yu et al.) shows a photoresist scum in dual damascene process.

U.S. Pat. No. 5,547,642 (Seiwa et al.) shows a photoresist scum removal process.

U.S. Pat. No. 61228,755 (Kusumi et al.) shows a dual damascene process.

U.S. Pat. No. 6,074,941 (Hsieh et al.) shows a poison via and plasma treatment process.

U.S. Pat. No. 5,643,407 (Chang) shows a shows a poison via and bake treatment process.

SUMMARY OF THE INVENTION

A principle objective of the invention is to remove photoresist scum from openings that have been created using a layer of photoresist.

In accordance with the objective of the invention a new method is provided of treating the wafer in or on the surface of which a patterned and developed layer of photoresist has been created for the purpose of creating openings in underlying layers of semiconductor material. The wafer is exposed, after the via or plug etch has been completed, to high temperature of between about 250 and 400 degrees C., using a hot plate or a furnace, in an environment of low or atmospheric pressure. The exposure of the wafer to elevated temperatures can be in an environment with or without inert gasses or with or without the presence of a base or forming gas. The dual damascene structure is then completed using a layer of DUV photo, an trench opening is created in the layer of DUV photoresist that aligns with the via opening.

BRIEF DESCRIPTION OF THE DRAWINGS

FIGS. 1a through 1c show a conventional process of creating a dual damascene plug and the thereby experienced accumulation of photoresist scum.

DESCRIPTION OF THE PREFERRED EMBODIMENTS

Figure 2A:
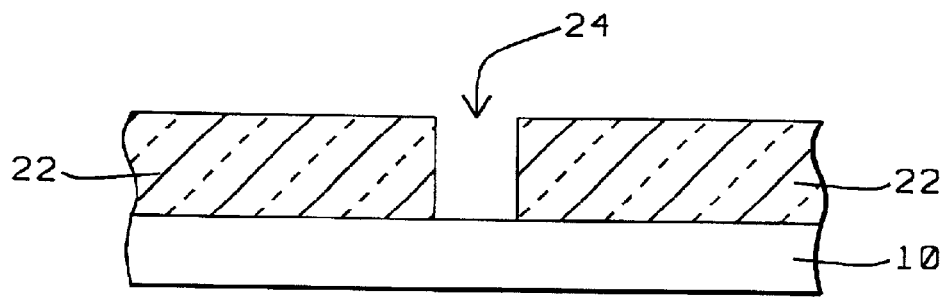
FIGS. 2a through 2g show a process of the invention of creating a dual damascene plug, the accumulation of photoresist scum is thereby removed.

The brief description of the process of metallization that has been given above has been described with reference to the damascene and dual damascene processes which are two widely used approaches in creating metal interconnects. The application of the damascene process has gained wide acceptance in the semiconductor industry, most notably in the process of copper metallization due to the difficulty of copper dry, etch where the damascene plug penetrates deep in very small, sub-half micron, Ultra Large Scale Integrated (ULSI) devices. Recent applications have successfully used copper as a conducting metal, most notably in the construct of CMOS 6-layer copper metal devices.

For the creation of the single damascene structure, vias only are created. For the creation of the dual damascene, vias are created and conductors are created above the vias. For the dual damascene, special etch procedures can be used to form both the vias and the conductor patterns in the dielectric layer before the deposition of metal and the metal CMP. A thin etch Stop layer can be used for this purpose between two layers of dielectric $SiO_2$.

The damascene process first etches the conductor pattern into the dielectric after which the etched pattern is filled with metal to create the buried metallization that also has a surface of good planarity. This damascene process also eliminates the need of a dielectric deposition in order to fill the gaps. A planarized metal deposition process can be used for this to fill the pattern that has been created in a dielectric layer of for instance $SiO_2$. An etchback or CMP process will remove the excess metal over the field regions, CMP thereby offers the advantage of providing a globally planarized surface. The indicated processing steps can be applied to both single and dual damascene.

For the dual damascene process, the processing steps can follow one of three approaches.

Approach 1, the via is created first. The via are formed by resist patterning after which an etch through a triple layer dielectric stack is performed. This is followed by patterning the conductor in the top layer of $SiO_2$, using a centrally located layer of SiN as an etch stop layer.

Approach 2, the conductor is created first. The conductor patterns is formed by resist patterning and by etching the conductor patterns into an upper layer of $SiO_2$, using a centrally located layer of SiN as an etch stop layer. This is followed by via resist patterning and etching through the thin layer of SiN and a lower layer of $SiO_2$.

Approach 3, etching an etch stop layer first. The first $SiO_2$ layer is deposited, followed by the thin layer of SiN as etch stop, followed by the via resist patterning and etching of the SiN layer. This is followed by depositing the top $SiO_2$ layer and then the conductor patterning. In etching the conductor pattern in the top $SiO_2$ layer, the etching process will be stopped by the SiN layer except where the via holes are already opened in the SiN layer thereby simultaneously completing the etching of the via holes in the first $SiO_2$ layer.

The specific problem that is addressed by the invention will next be described in detail using FIGS. 1a through 1c.

The cross section that is shown in FIG. 1a shows a partially completed semiconductor device 15, formed in or on the surface of a semiconductor wafer. Active devices are formed in or on the surface of the wafer, the substrate and the therein or thereover formed active devices are generally represented by the highlighted layer 10.

The created active devices are not specifically highlighted and will not be further discussed since the creation of these devices is well known in the art and is, in addition, not germane to the invention. The surface of layer 10 is planarized and serves after this step of planarization as a uniform flat surface over which additional structures, such as dual damascene structures, are to be formed. An initial layer 12 of dielectric is formed over the planarized surface of layer 10. This layer 12 of dielectric comprises a layer of Intra Level Dielectric (ILD) and serves to encapsulate and insulate interconnect components such as damascene structures that are formed over the surface 10.

The layer 12 of dielectric is typically formed using silicon dioxide but is not limited to this material and can also comprise other typically applied dielectrics such as silicon nitride ("nitride"), tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), tantalum pentoxide ($Ta_2O_5$), plasma enhanced silicon nitride (PSiNx), titanium oxide, oxynitride, a low dielectric constant material, such as hydrogen silsesquioxane, and HDP-FSG (high-density-plasma fluorine-doped silicide glass), which is a dielectric that has a lower dielectric constant than regular oxide. Some of the dielectrics, such as silicon dioxide, can be grown on the surface of the substrate or can be physically deposited by for instance a sputtering process or by other chemical methods of dielectric deposition. The native properties of a dielectric can further be altered by doping the dielectric layer by either n-type dopants such as arsenic and phosphorous or p-type dopants such as indium or boron. The method of forming the dielectric layer and the doping that is applied to this layer is determined by various device and processing considerations.

Further shown in cross section in FIG. 1a is a layer 14 of photoresist that is used for the creation of a pattern of openings in layer 12 of dielectric. The layer 14 of photoresist is relatively thick because, during additional steps of etch processing, the layer 14 of photoresist is partially consumed by the etch process. The layer 14 of photoresist must therefore be thick enough that this layer in fact overlies and protects the surface of layer 12. The underlying layer 12 of dielectric must not be affected by a subsequent etch process other than the intended etch of the layer 12 of dielectric where this intended etch is to remove the dielectric for the creation of an opening therein as shown in the cross section of FIG. 1b. Also shown in the cross section of FIG. 1b is a layer 13 of photoresist scum that remains in place essentially overlying the bottom of the opening that has been created through the layer 14 of photoresist.

Layer 14 of photoresist typically comprises a disposable solid layer. Materials that are used for a layer of photoresist can comprise polymers such as polyamide, parylene or teflon (a polymer made from PTFE (polytetrafluoroethylene)), electron resist, solid organics or inorganics, BCB (bisbenzocyclobutene), PMMA (poly-methyl-methacrylate) and other polymers such as polycarbonate (PC), polysterene (PS), polyoxide (PC) and poly polooxide (PPO).

Photolithography is a common approach in patterning underlying layers of semiconductor material such as layer 12 of dielectric. Patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive working) and form the pattern, or insoluble (negative working) and be washed away. In either case, the remaining resist on the surface forms the desired pattern.

Sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then be subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 14 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

FIG. 1c shows a cross section after the layer 12 has been etched in accordance with the photoresist mask 14. A layer 16 of residue of layers 12 and 14 remains in place inside opening 17 after the layer of photoresist has been exposed and developed and after opening 17 has been created through layer 12 of dielectric. It is clear that layer 16 interferes with subsequent deposition of conductive material over the surface of layer 12. This conductive material, typically metal, fills opening 17 and serves as an interconnect plug forming for instance the via plug or the trench section of a dual damascene structure.

Relating to the processing conditions that result in the cross section that is shown in FIG. 1c, the following comments apply. The layer 14 is, for reasons that have been highlighted, a relatively thick layer of material. This results in the requirement that the focus of exposure of the photolithographic system that is used for the exposure of layer 14 must be set centered approximately in the middle of the height (thickness) of layer 14. This means that the layer 14 of photoresist is not uniformly exposed through the thickness of the layer 14 and is therefore not uniformly prepared for a subsequent removal of the photoresist throughout opening 17. This is one of the reasons for the build-up of the photoresist scum 16 that is shown in cross section in FIG. 1c. Another reason for this build up is that polymer is formed as a by-products of the etch process of etching layer 12 of dielectric. The polymers will accumulate on the sidewalls of opening 17 and will, during the process of etching layer 12 of dielectric, gradually increase in volume, thereby gradually slowing down and finally stopping the process of etching layer 12. The etch of layer 12 may therefore not be able to completely penetrate layer 12, an effect that is made more severe by the layer 16 of photoresist scum that has accumulated over the bottom of opening 17 and over the lower extremities of the sidewalls of opening 17.

It is clear from the cross section that is shown in FIG. 1c that subsequent depositions of conductive material, which are required to create a conductive plug in opening 17, will not result in a uniform deposition of the conductive material throughout the cross section of opening 17. The conductive material will, due to the presence of the layer 16 of scum, be prevented from being deposited over the bottom and the lower extremities of the sidewalls of opening 17, thus being prevented from forming an interface with the underlying surface of layer 10. Conductive contact between the plug that fills opening 17 and an underlying point of electrical contact (not shown) in the surface of layer 10 can therefore not be established such that this contact is of low resistivity and high reliability. In order to meet these latter objectives, the layer 16 must be eliminated by either preventing the formation of layer 16 or by removing layer 16 after it has been formed.

In a typical application of which the cross-sections that are shown in FIGS. 1a through 1c are representative examples, an etch stop layer is formed over the surface of layer 10. This etch stop layer retards the etch of layer 12 in order to prevent damage to the surface of silicon substrate 10 and provides the end of the etch through layer 12. Multiple etch stop layers may also be applied for applications where multiple layers of dielectric are used for the creation of a dual damascene structure with for instance an etch stop layer being interspersed between a first (or lower) layer of dielectric and a second (or upper) layer of dielectric. These aspects of creating a dual damascene structure will not be discussed as part of the invention.

Processing conditions that are applied for the creation of the dual damascene structure are well known in the art and have previously been summarily highlighted. In addition, these processing conditions have previously been identified as not being germane to the invention, reasons that these processing conditions will not be further discussed at this time.

The invention will now specifically be described using FIGS. 2a through 2q. Referring specifically to the cross section that is shown in FIG. 2a, there are highlighted the following elements:

10, the surface of a silicon substrate, active devices (not shown) are assumed to have been created in or on the surface of the substrate 22, a layer of Inter Metal Dielectric (IMD)

24, an opening created through the layer 12 of IMD. Opening 12 through the layer 12 has been created preferably applying a wet etch process.

The creation of opening 24 through the layer 22 of IMD is a step that is part of a complete processing sequence of creating a damascene or a dual damascene structure although the creation of opening 24 is not limited to damascene structures. Conventional methods of semiconductor material deposition, photolithography and dielectric etching have been applied in order to create the structure that is shown in cross section in FIG. 2a. The opening 24 shown in FIG. 2a is an opening for the creation of an I-line plug for devices having deep sub-micron dimensions.

Figure 2B:
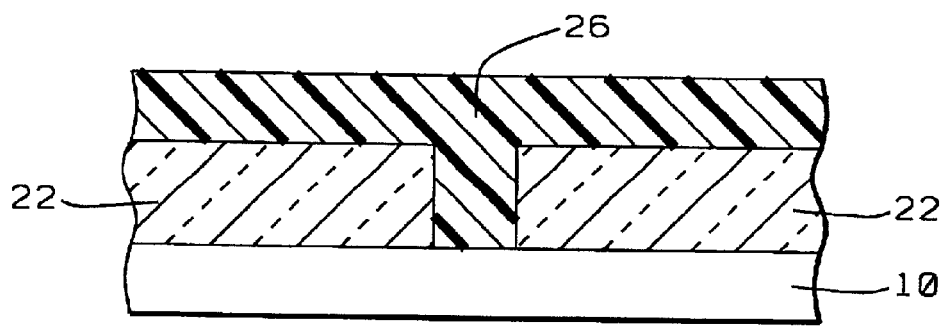

A protective layer must be deposited over the bottom surface of the opening 24, for this purpose a layer 26 of I-line photoresist is deposited over the surface of layer 22 as shown in cross section in FIG. 2b. Opening 24 is filled with the I-line photoresist while the layer 25 of I-line photoresist extends over the surface of layer 22. Because the I-line photoresist is desired to be present only over the bottom surface of opening 24, the I-line photoresist must be removed from above the surface of layer 22 of IMD and must further be partially removed from the upper region of opening 24. This is shown in cross section in FIG. 2c, after this process of removal of the I-line photoresist has been completed. The removal of the layer 26 of I-line photoresist applies conventional methods of I-line photoresist removal, leaving layer 26, FIG. 2c, deposited over the bottom surface of opening 24.

Figure 2C:
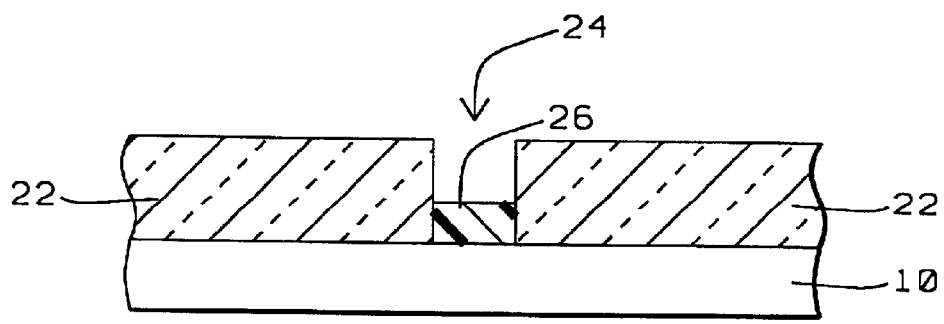
Figure 2D:
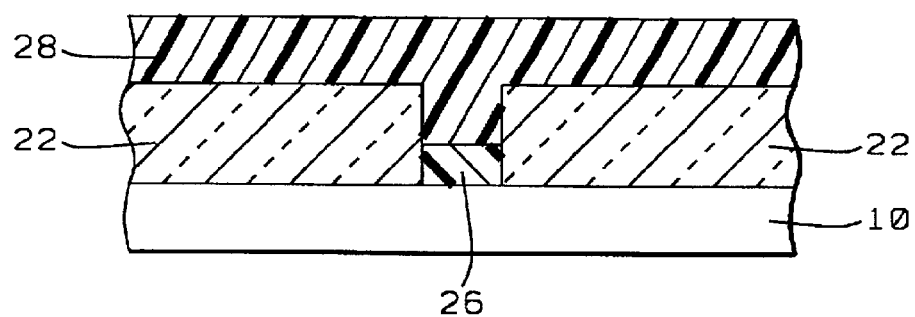

The invention continues, FIG. 2d, with the deposition of a layer 28 of Deep Ultra Violet (DUV) photoresist over the surface of layer 22 of IMD, filling the upper region of opening 24 down to the surface of layer 26 with DUV photoresist, see the cross section of FIG. 2d. It is known in the art that DUV photoresist 28 has a cross-link lambda parameter that is different that the cross-link lambda parameter of layer 26 of I-line photoresist. This allows for selective exposures of the two layers of photoresist, a selective exposure that results in the cross section shown in FIG. 2e.

Figure 2E:
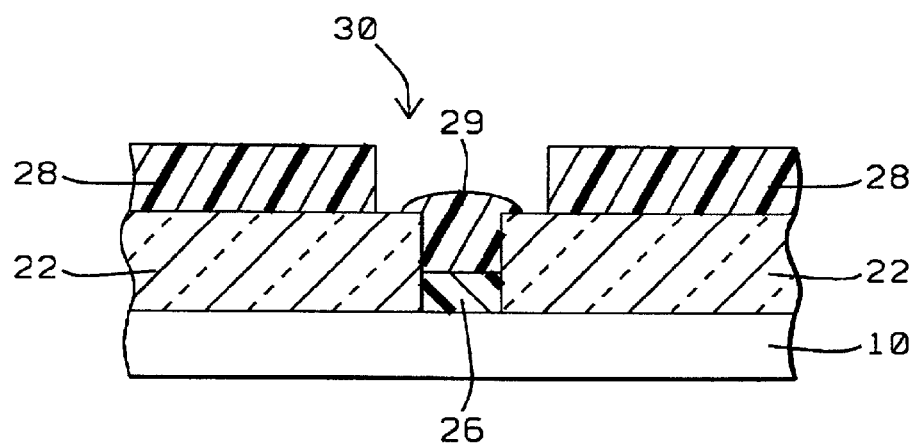

It is clear from the cross section that is shown in FIG. 2e that the opening 30 that is created through layer 28, which aligns with the opening 24 created through layer 22 (FIG. 2c), creates a combined opening that has the cross section of a dual damascene structure. Inhibiting however the creation of a dual damascene structure of desired performance characteristics of resistivity, reliability, adhesion to surrounding layers of dielectric and the like is the layer 29 of photoresist scum that remains in place overlying layer 26. This layer is formed as a consequence of processing conditions that have previously been highlighted, among these reasons incomplete reaction of the etch of the layer 28 of DUV photoresist and, further, due to adsorption or intrusion of moisture by the reacted DUV photoresist 26. The moisture, which plays a role in this process of forming scum layer 29 of photoresist, originates from the layer 22 of IMD. This formation of a layer 29 of scum photoresist has been observed to be dependent on the dielectric constant of the layer 22 of IMD, with an increase in the formation of this layer 29 taking place for low-k, non-oxide containing dielectric material.

Figure 2F:
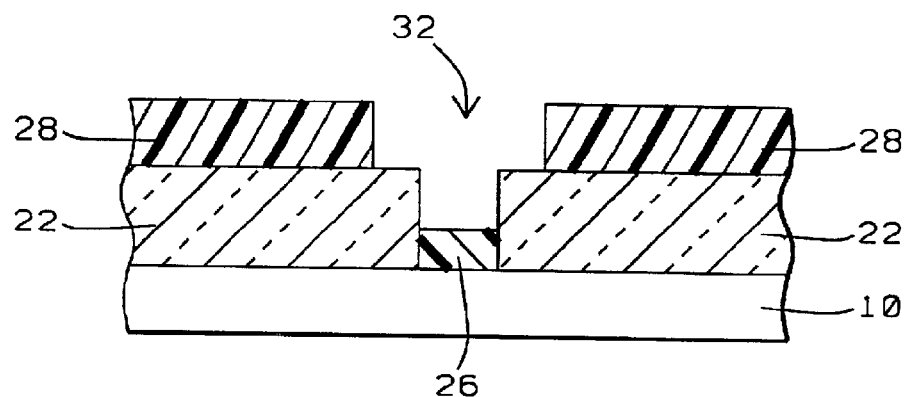

It is clear and has previously been highlighted that the formation of layer 29 must be prevented. The invention provides, for this purpose, a processing step that is performed after the completion of the structure that is shown in cross section in FIG. 2c, that is after the I-line layer of photoresist has been etched back and a significant portion of the sidewalls of opening 24, FIG. 2c, is exposed. At that time, that is after the processing step that results in the cross section shown in FIG. 2c and before the processing step of FIG. 2d of depositing layer of DUV photoresist, a baking step is added to the processing cycle. This baking step removes moisture from the layer 22 of IMD so that this moisture is no longer present during the step of etching the layer 28 of DUV photoresist, thus removing a key contributor to the formation of scum photoresist layer 29 of FIG. 2e. By then performing the steps of depositing layer 28 of DUV photoresist (FIG. 2d) and developing of the layer 28 of DUV photoresist, no layer of photoresist scum is formed and a cross section that is shown in FIG. 2f is achieved. From this cross section it is clear that the now familiar cross section of a dual damascene structure has been formed in the opening 32 that has been formed through layers 28 and 22 of respectively DUV photoresist and IMD. Layer 26 of I-line photoresist remains in place for the protection of the bottom surface of openings opening 32.

The processing steps for the baking step of the invention are as follows:

the baking is applied placing the wafer on a hot plate or inside a high-temperature furnace the temperature during the bake is between about 200 and 400 degrees C.

the wafer is exposed to the elevated temperature in a low pressure or an atmospheric pressure environment the low pressure during the high-temperature expose is about 50 pa, with a range of between about 40 and 60 pa the environment in which the wafer is exposed to elevated temperatures may or may not contain an inert gas the environment in which the wafer is exposed to elevated temperatures may or may not contain an annealing agent that is typically applied for an anneal environment in which a metal is present such as $H_2$ or $N_2$ or $NH_3$ and the like the wafer is exposed to elevated temperatures for time period between about 1 and 30 minutes.

Figure 2G:
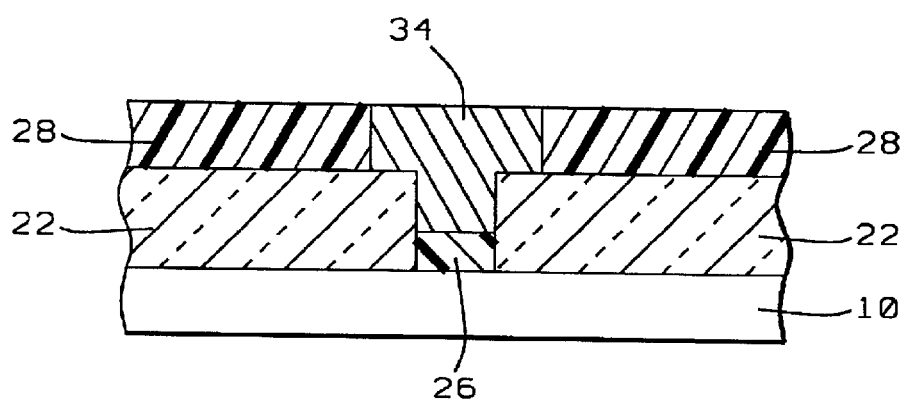

FIG. 2g shows the cross section of the dual damascene structure after the opening 32, FIG. 2f, has been filled with copper, creating the dual damascene plug 34. The layer of copper that has for this purpose been deposited over the surface of layer 28 has been polished or etched down to essentially the surface of layer 28, leaving the dual damascene plug inside opening 32. No photoresist scum is at this time present to inhibit proper creation of the dual damascene plug 34. The invention can be summarized as being a method of forming a dual damascene structure for copper dual damascene, as follows:

a substrate is provided, the substrate having been provided with semiconductor devices structures in or on the surface thereof, at least one point of electrical contact having been provided in the surface of the substrate, a layer of Inter Metal Dielectric (IMD) having been deposited over the surface of the substrate, at least one opening having been created through the layer of IMD, the at least one opening being aligned with the at least one point of electrical contact having been provided in the surface of the substrate a layer of first semiconductor material is deposited over the surface of the layer of IMD, filling the at least one opening created through the layer of IMD the layer of first semiconductor material is removed from the surface of the layer of IMD, thereby partially removing the first semiconductor material from the at least one opening created through the layer of IMD, creating at least one partial opening through the layer of IMD the substrate is baked for a period of time by applying an elevated temperature in a gaseous environment and under a pressure to the substrate a layer of second semiconductor material is deposited over the surface of the layer of IMD, thereby filling the at least one partial opening created through the layer of IMD, and the layer of second semiconductor material is patterned and etched, creating an opening through the layer of second semiconductor material that aligns with the at least one partial opening created through the layer of IMD, removing the layer of second semiconductor material from the at least one partial opening created through the layer of IMD.

Additional steps can be performed as follows:

a layer of copper is deposited over the surface of the second layer of semiconductor material, thereby filling the opening created through the second layer of semiconductor material that aligns with the at least one partial opening created through the layer of IMD, thereby further filling the at least one partial opening created through the layer of IMD, and the deposited layer of copper is removed from the surface of the layer of second semiconductor material, applying steps of copper etch or steps of Chemical Mechanical Polishing (CMP).

Although the invention has been described and illustrated with reference to specific illustrative embodiments thereof, it is not intended that the invention be limited to those illustrative embodiments. Those skilled in the art will recognize that variations can be made without departing from the spirit of the invention. It is therefore intended to include within the invention all such variations and modifications which fall within the scope of the appended claims and equivalents thereof.

What is claimed is:

1. A method of forming a dual damascene structure for copper dual damascene processes, comprising:

providing a substrate, said substrate having been provided with semiconductor devices structures, at least one point of electrical contact having been provided in said substrate, a layer of Inter Metal Dielectric (IMD)

having been deposited over said substrate, at least one opening having been created through said layer of IMD, said at least one opening being aligned with said at least one point of electrical contact;

depositing a layer of first material over said layer of IMD, filling said at least one opening;

removing said layer of first material from said layer of IMD, thereby partially removing said first material from said at least one opening, creating at least one partial opening through said layer of IMD, said at least one partial opening having a first and a second cross section;

baking said substrate for a period of time by applying an elevated temperature in a gaseous environment and under a pressure to said substrate;

depositing a layer of second material over said layer of IMD, thereby filling said second cross section of said at least one partial opening; and patterning and etching said layer of second material, creating an opening through said layer of second material that aligns with said at least one partial opening created through said layer of IMD, removing said layer of second material from said second cross section of said at least one partial opening created through said layer of IMD.

2. The method of claim 1, said first material comprising I-line photoresist.

3. The method of claim 1, said second material comprising DUV photoresist.

4. The method of claim 1, wherein said baking said substrate comprises baking said substrate on a hot plate.

5. The method of claim 1, wherein said baking said substrate comprises baking said substrate inside a high-temperature furnace.

6. The method of claim 1, wherein said applying an elevated temperature comprises applying a temperature between about 200 and 400 degrees C.

7. The method of claim 1, wherein said pressure comprises a low pressure environment of between about 40 and 60 pa.

8. The method of claim 1, wherein said pressure comprises an atmospheric pressure.

9. The method of claim 1, wherein said gaseous environment may or may not contain an inert gas.

10. The method of claim 1, wherein said gaseous environment may or may not contain an annealing agent that is typically applied for an anneal environment in which a metal is present.

11. The method of claim 10, wherein said annealing agent is selected from the group consisting of $H_2$ and $N_2$ and $NH_3$.

12. The method of claim 1, wherein said period of time is between about 1 and 30 minutes.

13. The method of claim 1, with additional steps being performed after said patterning and etching said second layer of material, said additional steps comprising:

depositing a layer of copper over said second layer of material, thereby filling said opening created through said second layer of material that aligns with said at least one partial opening created through said layer of IMD, thereby further filling said second cross section of said at least one partial opening created through said layer of IMD; and removing said deposited layer of copper from said layer of second material.

14. The method of claim 13, said step of removing said deposited layer of copper from said layer of second material comprising steps of copper etch.

15. The method of claim 13, said step of removing said deposited layer of copper from said layer of second material comprising steps of Chemical Mechanical Polishing.

16. The method of claim 1, said layer of IMD comprising a layer of low-k dielectric.

17. The method of claim 1, said at least one opening having been created through said layer of IMD comprising applying a wet etch process.

18. The method of claim 1, said at least one opening being created in preparation for creating a damascene or a dual damascene structure, said at least one opening comprising an I-line plug for devices having deep sub-micron dimensions.

19. The method of claim 1, said at least one partial opening being aligned with said at least one opening, said at least one partial opening comprising a first cross section comprising remnants of said first material remaining in place over a bottom surface of said at least one opening, said at least one partial opening further comprising a second cross section overlying said first cross section and from which said first material has been removed.

20. The method of claim 1, said baking comprising removing moisture from the layer of first material, thereby preventing formation of scum deposits over the first cross of said at least one opening, thereby removing an inhibitor to removing a layer of second material from above the first cross section of said at least one opening since moisture is no longer present in the layer of first material during etching of the layer of second material.

21. The method of claim 1, said layer of second material having a cross-link lambda parameter that is different from the cross-link lambda parameter of the layer of first material, thereby allowing selective exposures of the layers of first and second material.

22. A method of forming a dual damascene structure for copper dual damascene processes, comprising:

providing a substrate, said substrate having been provided with semiconductor devices structures, at least one point of electrical contact having been provided in said substrate;

depositing a first layer of dielectric over said substrate;

creating at least one first opening through said first layer of dielectric, said at least one first opening being aligned with said at least one point of electrical contact;

creating a layer of protective material over a bottom surface of said at least one first opening;

baking said substrate, including said first layer of dielectric and said layer of protective material;

depositing a second layer of dielectric over said first layer of dielectric, filling said at least one first opening by depositing said second layer of dielectric over said layer of protective material;

creating at least one second opening through said second layer of dielectric, said at least one second opening being aligned with said at least one first opening, said at least one second opening comprising said at least one first opening where this at least one first opening extends above said layer of protective material.

23. The method of claim 22, said creating a layer of protective material over a bottom surface of said at least one first opening comprising:

depositing a layer of protective material over said first layer of dielectric, filling said at least one opening created through said first layer of dielectric;

removing said layer of protective material from said first layer of dielectric, thereby partially removing said protective material from said at least one opening created through said first layer of dielectric, creating at least one partial opening through said first layer of dielectric, said at least one partial opening comprising:
(i) a layer of protective material over a bottom surface of said at least one first opening, and
(ii) a region overlying the layer of protective material from which said layer of protective material has been removed.

24. The method of claim 23, said protective material comprising I-line photoresist.

25. The method of claim 22, said first layer of dielectric comprising Inter Metal Dielectric (IMD).

26. The method of claim 22, said second layer of dielectric comprising DUV photoresist.

27. The method of claim 22, said baking comprising baking said substrate for a period of time by applying an elevated temperature in a gaseous environment and under a pressure to said substrate.

28. The method of claim 27, wherein said baking said substrate comprises baking said substrate on a hot plate.

29. The method of claim 27, wherein said baking said substrate comprises baking said substrate inside a high-temperature furnace.

30. The method of claim 27, wherein said applying an elevated temperature comprises applying a temperature between about 200 and 400 degrees C.

31. The method of claim 27, wherein said pressure comprises a low pressure environment of between about 40 and 60 pa.

32. The method of claim 27, wherein said pressure comprises an atmospheric pressure.

33. The method of claim 27, wherein said gaseous environment may or may not contain an inert gas.

34. The method of claim 27, wherein said gaseous environment may or may not contain an annealing agent that is typically applied for an anneal environment in which a metal is present.

35. The method of claim 34, wherein said annealing agent is selected from the group consisting of $H_2$ and $N_2$ and $NH_3$.

36. The method of claim 27, wherein said period of time is between about 1 and 30 minutes.

37. The method of claim 22, with additional steps being performed after creating at least one second opening through said second layer of dielectric, said additional steps comprising:

depositing a layer of copper over said second layer of dielectric, thereby filling said at least one opening created through said second layer of dielectric that aligns with said at least one partial opening created through said first layer of dielectric, thereby further filling said at least one partial opening created through said first layer of dielectric; and removing said deposited layer of copper from said second layer of dielectric.

38. The method of claim 37, said step of removing said deposited layer of copper from said second layer of dielectric comprising steps of copper etch.

39. The method of claim 37, said step of removing said deposited layer of copper from said second layer of dielectric comprising steps of Chemical Mechanical Polishing.

40. The method of claim 22, said first layer of dielectric comprising a layer of low-k dielectric.

41. The method of claim 22, said at least one opening having been created through said first layer of dielectric comprising applying a wet etch process.

42. The method of claim 18, said at least one opening being created in preparation for creating a damascene or a dual damascene structure, said at least one opening comprising an I-line plug for devices having deep sub-micron dimensions.

43. The method of claim 18, said baking comprising removing moisture from the first layer of dielectric, thereby preventing formation of scum deposits over the layer of protective material, thereby removing an inhibitor to removing a second layer of dielectric from above the layer of protective material since moisture is no longer present in the first layer of dielectric during etching of the second layer of dielectric.

44. The method of claim 22, said second layer of dielectric having a cross-link lambda parameter that is different from the cross-link lambda parameter of the first layer of dielectric, thereby allowing selective exposures of the first and second layers of dielectric.

* * * * *